US010522356B2

(12) United States Patent
Tsai et al.

(10) Patent No.: US 10,522,356 B2
(45) Date of Patent: Dec. 31, 2019

(54) METHODS AND SYSTEMS FOR DOPANT ACTIVATION USING MICROWAVE RADIATION (71) Applicant: Taiwan Semiconductor Manufacturing Company Limited, Hsinchu (TW)

(72) Inventors: Chun-Hsiung Tsai, Hsinchu County (TW); Huai-Tei Yang, Hsinchu (TW); Kuo-Feng Yu, Hsinchu (TW); Kei-Wei Chen, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 52 days.

(21) Appl. No.: 15/488,657

(22) Filed: Apr. 17, 2017

(65) Prior Publication Data

US 2017/0221713 A1    Aug. 3, 2017

Related U.S. Application Data

(63) Continuation of application No. 15/217,024, filed on Jul. 22, 2016, now Pat. No. 9,627,212, which is a (Continued)

(51) Int. Cl.
*H01L 21/268*    (2006.01)
*H01L 21/02*    (2006.01)
(Continued)

(52) U.S. Cl.
CPC .... *H01L 21/2686* (2013.01); *H01L 21/02532* (2013.01); *H01L 21/02584* (2013.01);
(Continued)

(58) Field of Classification Search
CPC ............... H01L 21/268; H01L 21/2686; H01L 21/02584; H01L 29/36–365
See application file for complete search history.

(56) References Cited

U.S. PATENT DOCUMENTS 5,908,313 A    6/1999  Chau et al.
5,923,070 A *  7/1999  Yamada ............. H01L 29/6659
                                                          257/408

(Continued)

FOREIGN PATENT DOCUMENTS

CN    101395712       3/2009
CN    104299971 A     1/2015
(Continued)

OTHER PUBLICATIONS

Taiwan Office Action; Application No. 104126493; dated Jul. 19, 2016.
(Continued)

*Primary Examiner* — Cory W Eskridge
(74) *Attorney, Agent, or Firm* — Haynes and Boone, LLP (57) ABSTRACT

A semiconductor structure includes a substrate, a source/drain (S/D) junction, and an S/D contact. The S/D junction is associated with the substrate and includes a trench-defining wall, a semiconductor layer, and a semiconductor material. The trench-defining wall defines a trench. The semiconductor layer is formed over the trench-defining wall, partially fills the trench, substantially covers the trench-defining wall, and includes germanium. The semiconductor material is formed over the semiconductor layer and includes germanium, a percentage composition of which is greater than a percentage composition of the germanium of the semiconductor layer. The S/D contact is formed over the S/D junction.

20 Claims, 10 Drawing Sheets

Related U.S. Application Data continuation of application No. 14/688,002, filed on Apr. 16, 2015, now Pat. No. 9,401,274, which is a continuation-in-part of application No. 13/963,043, filed on Aug. 9, 2013, now Pat. No. 9,012,315.

(51) Int. Cl.

| | | |
|---|---|---|
| *H01L 21/67* | (2006.01) | |
| *H05B 6/80* | (2006.01) | |
| *H01L 29/78* | (2006.01) | |
| *H01L 21/324* | (2006.01) | |
| *H01L 21/225* | (2006.01) | |
| *H01L 29/08* | (2006.01) | |
| *H01L 29/167* | (2006.01) | |
| *H01L 29/32* | (2006.01) | |
| *H01L 29/66* | (2006.01) | |
| *H01L 21/768* | (2006.01) | |
| *H01L 29/45* | (2006.01) | |

(52) U.S. Cl.
CPC .... *H01L 21/02694* (2013.01); *H01L 21/2252* (2013.01); *H01L 21/2254* (2013.01); *H01L 21/324* (2013.01); *H01L 21/67115* (2013.01); *H01L 21/76895* (2013.01); *H01L 29/0847* (2013.01); *H01L 29/167* (2013.01); *H01L 29/32* (2013.01); *H01L 29/45* (2013.01); *H01L 29/66636* (2013.01); *H01L 29/66795* (2013.01); *H01L 29/785* (2013.01); *H01L 29/7848* (2013.01); *H01L 29/7851* (2013.01); *H05B 6/80* (2013.01)

(56) References Cited

U.S. PATENT DOCUMENTS

| | | | | |
|---|---|---|---|---|
| 8,338,831 B2 * | 12/2012 | Tamura | ........... | H01L 21/823807 257/190 |
| 8,994,104 B2 * | 3/2015 | Glass | ...................... | H01L 29/36 257/335 |
| 2007/0212859 A1 * | 9/2007 | Carey | ............... | H01L 21/26506 438/487 |
| 2008/0197412 A1 * | 8/2008 | Zhang | ................. | H01L 29/0847 257/344 |
| 2010/0184281 A1 | 7/2010 | Hsu et al. | | |
| 2011/0008952 A1 | 1/2011 | Aoyama | | |
| 2011/0068407 A1 | 3/2011 | Yeh et al. | | |
| 2011/0073952 A1 * | 3/2011 | Kwok | ................... | H01L 29/045 257/368 |
| 2012/0153387 A1 * | 6/2012 | Murthy | ............. | H01L 21/28512 257/335 |
| 2013/0248999 A1 * | 9/2013 | Glass | ...................... | H01L 29/36 257/335 |
| 2013/0270561 A1 | 10/2013 | Cheng et al. | | |
| 2014/0287561 A1 | 9/2014 | Liu et al. | | |
| 2015/0041966 A1 | 2/2015 | Tsai et al. | | |

FOREIGN PATENT DOCUMENTS

| | | |
|---|---|---|
| CN | 104347366 A | 2/2015 |
| DE | 68928396 | 2/1998 |
| DE | 19983188 | 5/2001 |
| DE | 112008000094 | 1/2010 |
| DE | 112004002409 | 5/2010 |
| DE | 112011101433 | 3/2013 |
| DE | 102012214072 | 9/2013 |
| DE | 102013013514 | 2/2014 |
| JP | 2002280304 | 9/2002 |
| JP | 2006503422 | 1/2006 |
| JP | 2013069977 | 4/2013 |
| KR | 20070020426 | 2/2007 |
| KR | 100766038 | 10/2007 |
| KR | 20140062031 | 5/2014 |
| KR | 20150009446 | 1/2015 |
| KR | 20150018367 | 2/2015 |

OTHER PUBLICATIONS

German Office Action; Application No. 10 2015 106 397.2; dated Apr. 14, 2016.
Korean Notice of Allowance; Application No. 10-2014-0078336; dated Nov. 2, 2015.
Korean Office Action; Application No. 10-2015-0101170; dated Feb. 1, 2016.
Korean Notice of Allowance; Application No. 10-2015-0101170; dated Aug. 12, 2016.
Chinese Office Action; Application No. 201310512941.9; dated Aug. 29, 2016.

* cited by examiner

METHODS AND SYSTEMS FOR DOPANT ACTIVATION USING MICROWAVE RADIATION

CROSS-REFERENCE TO RELATED APPLICATION

This application is a continuation of U.S. patent application Ser. No. 15/217,024, filed Jul. 22, 2016, which is a continuation of U.S. patent application Ser. No. 14/688,002, filed Apr. 16, 2015, which issued as U.S. Pat. No. 9,401,274, and which is a continuation-in-part of U.S. patent application Ser. No. 13/963,043, filed Aug. 9, 2013, and which issued as U.S. Pat. No. 9,012,315, both of which are incorporated herein by reference in their entirety.

FIELD

The technology described in this patent document relates generally to semiconductor materials and more particularly to processing of semiconductor materials.

BACKGROUND

Fabrication of semiconductor devices often involves many process steps. For example, the process of fabricating a field effect transistor usually includes doping a semiconductor substrate (e.g., adding desired impurities into the substrate) to form source/drain junctions. Many different methods may be implemented for doping the substrate, such as ion implantation, diffusion, and epitaxial growth. Further, the dopants introduced into the substrate often need to be electrically activated before semiconductor devices can be fabricated on the substrate. The activation of the dopants often includes dissolving dopant clusters, and transferring the dopant atoms/molecules from interstitial positions into lattice sites of the lattice structure of the substrate. As an example, the dopants may be activated using rapid thermal annealing (RTA), or millisecond thermal annealing (MSA).

Under certain circumstance, the fabrication process of semiconductor devices involves microwave radiation which typically includes electromagnetic waves with wavelengths ranging from 1 m to 1 mm (corresponding to frequencies between 0.3 and 300 GHz). When microwave radiation is applied to a certain material (e.g., a dielectric material) which includes electric dipoles, the dipoles change their orientations in response to the changing electric fields of the microwave radiation and thus the material may absorb the microwave radiation to generate heat. The response of the material to the electric field of the microwave radiation can be measured using a complex permittivity, $\varepsilon(\omega)=*$, which depends on the frequency of the electric field:

$$\varepsilon(\omega)^* = \varepsilon(\omega)' - \varepsilon(\omega)'' = \varepsilon_0(\varepsilon_r(\omega)' - i\varepsilon_r(\omega)'') \quad (1)$$

where $\omega$ represents the frequency of the electric field, $\varepsilon(\omega)'$ represents a real component of the complex permittivity (i.e., a dielectric constant), and $\varepsilon(\omega)''$ represents a dielectric loss factor. In addition, $\varepsilon_0$ represents the permittivity of a vacuum, $\varepsilon_r(\omega)'$ represents the relative dielectric constant, and $\varepsilon_r(\omega)''$ represents the relative dielectric loss factor.

Whether a material can absorb the microwave radiation can be characterized using a loss tangent, tan $\delta$:

$$\tan\delta = \frac{\varepsilon''\mu' - \varepsilon'\mu''}{\varepsilon'\mu' + \varepsilon''\mu''} \quad (2)$$

where $\mu'$ represents a real component of the magnetic permeability of the material, and $\mu''$ represents a magnetic loss factor. Assuming negligible magnetic loss (i.e., $\mu''=0$), the loss tangent of a material is expressed as follows:

$$\tan\delta = \frac{\varepsilon''}{\varepsilon'} = \frac{\varepsilon_r''}{\varepsilon_r'} \quad (3)$$

Materials with a low loss tangent (e.g., tan $\delta$<0.01) allow microwaves to pass through with very little absorption. Materials with an extremely high loss tangent (e.g., tan $\delta$>10) reflect microwaves with little absorption. Materials with an intermediate loss tangent (e.g., 10≥tan $\delta$≥0.01) can absorb microwave radiation.

DETAILED DESCRIPTION

The conventional technology for dopant activation, such as RTA and MSA, often involves high processing temperatures. For example, RTA is usually performed at a temperature higher than 950° C., and MSA at a temperature higher than 1050° C. Such high processing temperatures may not be suitable for some modern semiconductor devices. For example, certain materials (e.g., germanium, tin) used in modern complementary metal-oxide-semiconductor (CMOS) devices have low melting points, which limits the processing temperature for fabricating the devices.

Figure 1:
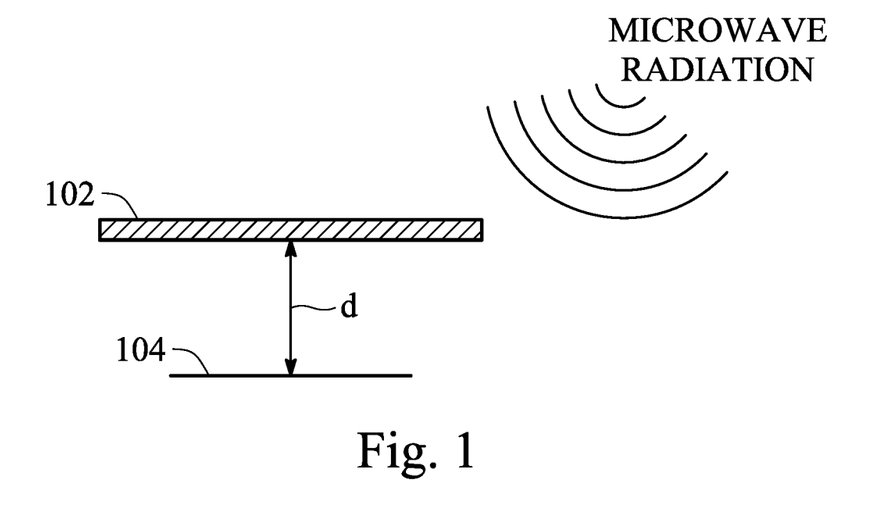
FIG. 1 depicts an example diagram for dopant activation using microwave radiation.

FIG. 1 depicts an example diagram for dopant activation using microwave radiation. As shown in FIG. 1, an microwave-absorption material 102 is placed at a distance (e.g., d) from a semiconductor structure 104 which includes dopants, where microwave radiation may be applied to both the microwave-absorption material 102 and the semiconductor structure 104 in order to activate the dopants in the semiconductor structure 104.

The semiconductor structure 104 which has a small loss tangent may not absorb microwave radiation efficiently. On the other hand, the microwave-absorption material 102 which has a larger loss tangent (e.g., in a range of about 0.01 to about 2) may absorb sufficient microwave radiation and increase an electric field density over the semiconductor structure 104. At the raised electric field density, the loss tangent of the semiconductor structure 104 may increase, and the semiconductor structure 104 may absorb the microwave radiation more efficiently so that the dopants within the semiconductor structure 104 may be activated for fabrication of semiconductor devices.

For example, the semiconductor structure 104 may include a junction with a number of dopants. The junction including the dopants may be formed on a substrate at an elevated temperature (e.g., in a range of about 300° C. to about 600° C.) by epitaxial growth, for example, through chemical vapor deposition (CVD). In response to the applied microwave radiation, the microwave-absorption material 102 intensifies the electric field density over the semiconductor structure 104. More and more dipoles related to the dopants may be formed in the semiconductor structure 104, and these dipoles may vibrate and/or rotate in response to the applied microwave radiation. The semiconductor structure 104 may absorb more microwave radiation under the increased electric field density. Once the electric field density over the semiconductor structure 104 exceeds a threshold, the dipole formation and the dipole motions (e.g., vibration and/or rotation) may eventually break down the bonds between the dopants and the interstitial sites in the semiconductor structure 104, so that the dopants may be activated. The distance between the microwave-absorption material 102 and the semiconductor structure 104 may be adjusted to improve the dopant activation. For example, the dopants may include phosphorous, phosphorous-based molecules, germanium, helium, boron, boron-based molecules, or a combination thereof.

In one embodiment, the microwave radiation applied to the microwave-absorption material 102 may have a frequency in the range of about 2 GHz to about 10 GHz. For example, the microwave-absorption material 102 may include boron-doped silicon germanium, silicon phosphide, titanium, nickel, silicon nitride, silicon dioxide, silicon carbide, or a combination thereof. The microwave-absorption material 102 may have a much larger size than the semiconductor structure 104 so that the electric field density may be approximately uniform over the semiconductor structure 104. As an example, the semiconductor structure 104 may include a semiconductor substrate, a semiconductor-on-insulator structure, or a semiconductor thin film structure.

In another embodiment, to control dopant diffusion, the temperature of the semiconductor structure 104 may be kept within a range of about 500° C. to about 600° C. For example, the microwave radiation may be applied to the microwave-absorption material 102 and the semiconductor structure 104 for a time period within a range of about 40 seconds to about 300 seconds.

Figure 2:
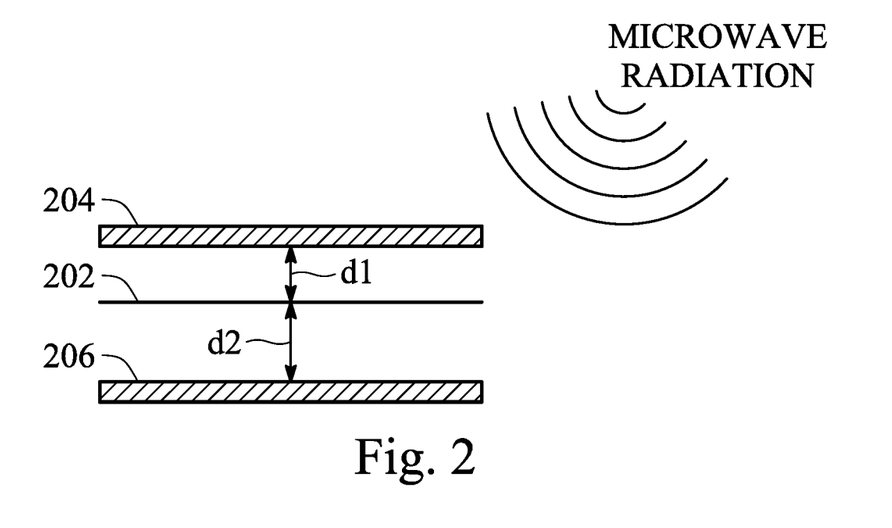
FIG. 2 depicts another example diagram for dopant activation using microwave radiation.

FIG. 2 depicts another example diagram for dopant activation using microwave radiation. As shown in FIG. 2, a semiconductor structure 202 including dopants is placed between two microwave-absorption materials 204 and 206, where microwave radiation may be applied to the semiconductor structure 202 and the microwave-absorption materials 204 and 206 in order to activate the dopants in the semiconductor structure 202. For example, the microwave-absorption materials 204 and 206 may have the same loss tangent or different loss tangents. As an example, the distance (e.g., d1) between the microwave-absorption material 204 and the semiconductor structure 202 may be the same as or different from the distance (e.g., d2) between the microwave-absorption material 206 and the semiconductor structure 202. The distances d1 and d2 may be adjusted to improve the dopant activation. In one embodiment, the microwave-absorption material 204 may be placed above a top surface of the semiconductor structure 202, and the microwave-absorption material 206 may be placed below a bottom surface of the semiconductor structure 202. In another embodiment, the microwave-absorption material 204 may be placed over a side surface of the semiconductor structure 202, and the microwave-absorption material 206 may be placed over another side surface of the semiconductor structure 202. In yet another embodiment, multiple microwave-absorption materials may be placed above the top surface, below the bottom surface, and over one or more side surfaces of the semiconductor structure 202.

Figure 3:
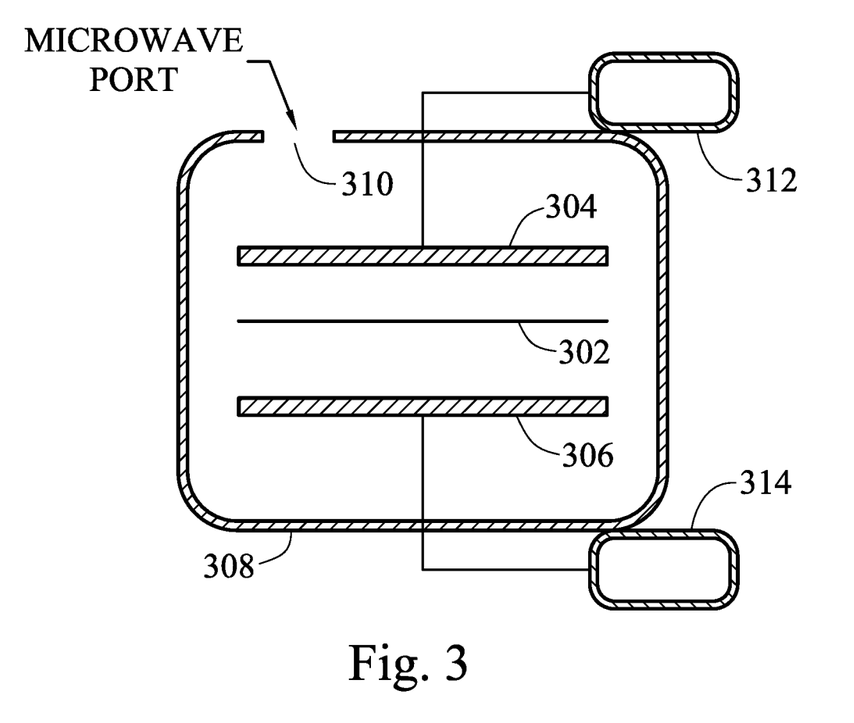
FIG. 3 depicts an example diagram showing an apparatus for dopant activation using microwave radiation.

FIG. 3 depicts an example diagram showing an apparatus for dopant activation using microwave radiation. As shown in FIG. 3, a semiconductor structure 302 including dopants is placed between two microwave-absorption materials 304 and 306 within a shell 308. The shell 308 includes one or more microwave ports 310 through which microwave radiation may be introduced. For example, the shell 308 may be made of a metal material. The microwave-absorption materials 304 and 306 may be pre-heated to predetermined temperatures (e.g., in a range of about 500° C. to about 600° C.) by heat sources 312 and 314, respectively, so as to enhance absorption of microwave radiation by the microwave-absorption materials 304, 306. For example, the heat sources 312 and 314 may include an Ar lamp, a Xeon lamp, or a tungsten-halogen lamp. In another example, the heat sources 312 and 314 may include one or more electrical power sources (e.g., silicon-controlled rectifiers).

Figure 4:
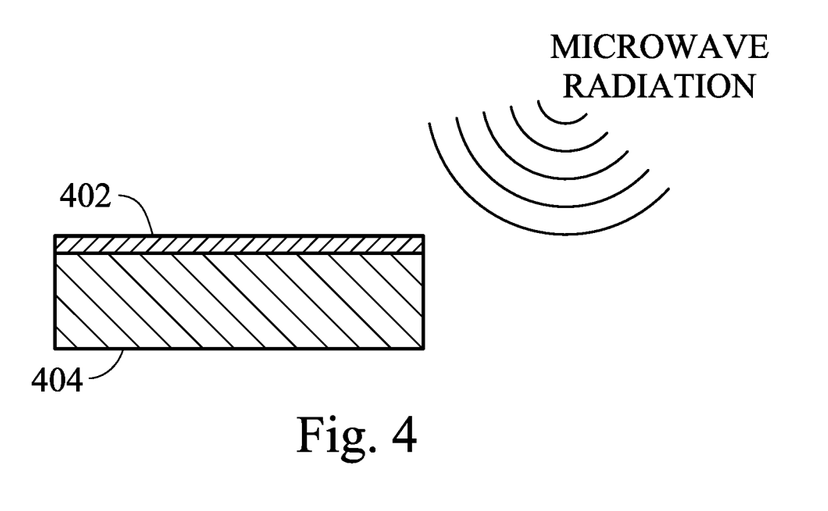
FIG. 4 depicts an example diagram for dopant activation using microwave radiation.

FIG. 4 depicts an example diagram for dopant activation using microwave radiation. As shown in FIG. 4, a microwave-absorption layer 402 may be formed on a semiconductor structure 404 which includes dopants, where microwave radiation may be applied to the microwave-absorption layer 402 and the semiconductor structure 404. For example, the microwave-absorption layer 402 may be formed on the semiconductor structure 404 through epitaxial growth (e.g., CVD). The thickness of the microwave-absorption layer 402 may be adjusted, e.g., between about 30 nm and about 250 nm, to improve the dopant activation. For example, the microwave-absorption layer 402 may be formed on the semiconductor structure 404 through epitaxial growth (e.g., CVD). After the dopant activation, the microwave-absorption layer 402 may be substantially removed, for example, through etching (e.g., wet etching, dry etching) or chemical-mechanical polishing.

Figure 5:
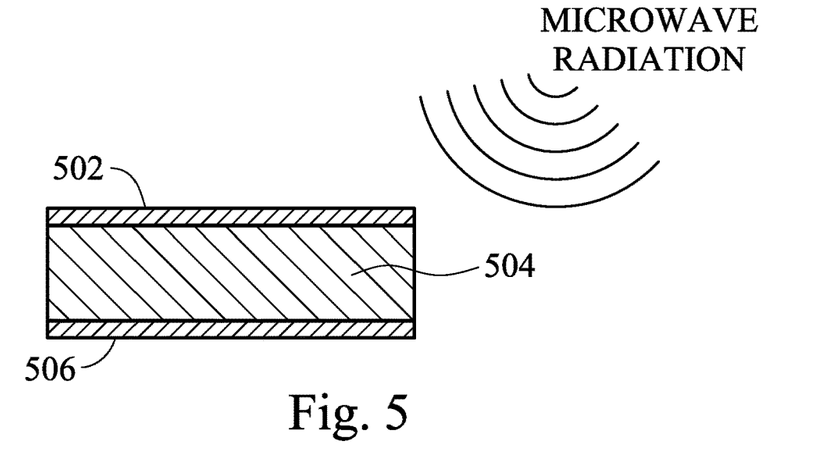
FIG. 5 depicts another example diagram for dopant activation using microwave radiation.

FIG. 5 depicts another example diagram for dopant activation using microwave radiation. As shown in FIG. 5, a microwave-absorption layer 502 may be formed on a top surface of a semiconductor structure 504 which includes dopants, and another microwave-absorption layer 506 may be formed on a bottom surface of the semiconductor structure 504. Microwave radiation may be applied to the semiconductor structure 504 and the microwave-absorption layers 502 and 506 for dopant activation. In one embodiment, the microwave-absorption layer 502 may be formed on a side surface of the semiconductor structure 504, and the microwave-absorption layer 506 may be formed on another side surface of the semiconductor structure 504. In another embodiment, multiple microwave-absorption layers may be formed on the top surface, on the bottom surface, and on one or more side surfaces of the semiconductor structure 504.

Figure 6:
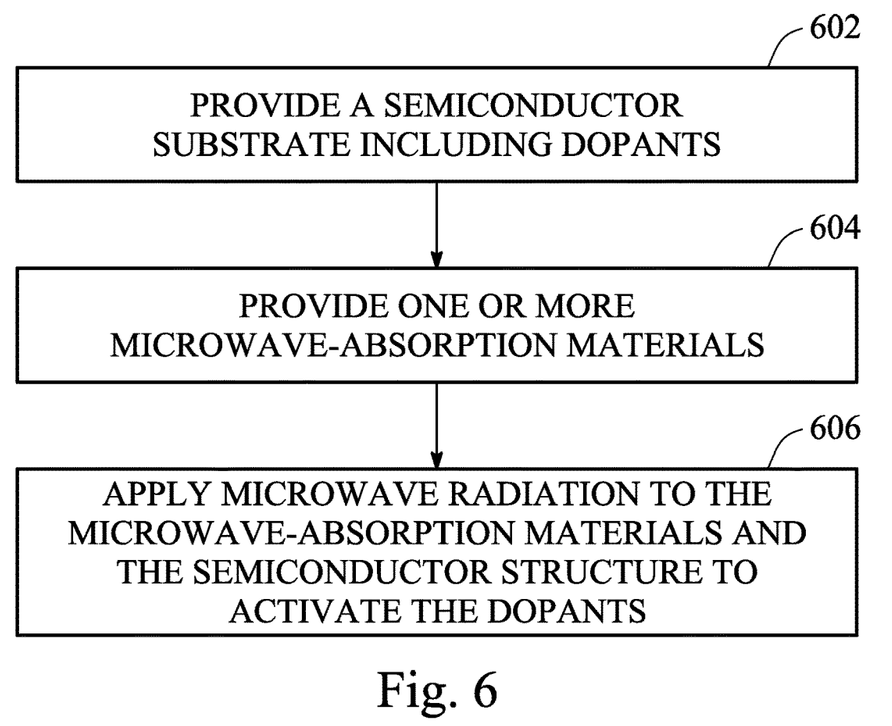
FIG. 6 depicts an example flow chart for dopant activation using microwave radiation.

FIG. 6 depicts an example flow chart for dopant activation using microwave radiation. As shown in FIG. 6, at 602, a semiconductor structure is provided, where the semiconductor structure includes a plurality of impurities, such as dopants. At 604, one or more microwave-absorption materials are provided. The microwave-absorption materials are capable of increasing an electric field density associated with the semiconductor structure. At 606, microwave radiation is applied to the microwave-absorption materials and the semiconductor structure to activate the plurality of dopants for fabricating semiconductor devices. The microwave-absorption materials are configured to increase the electric field density in response to the microwave radiation so as to increase the semiconductor structure's absorption of the microwave radiation to activate the dopants.

Figure 13:
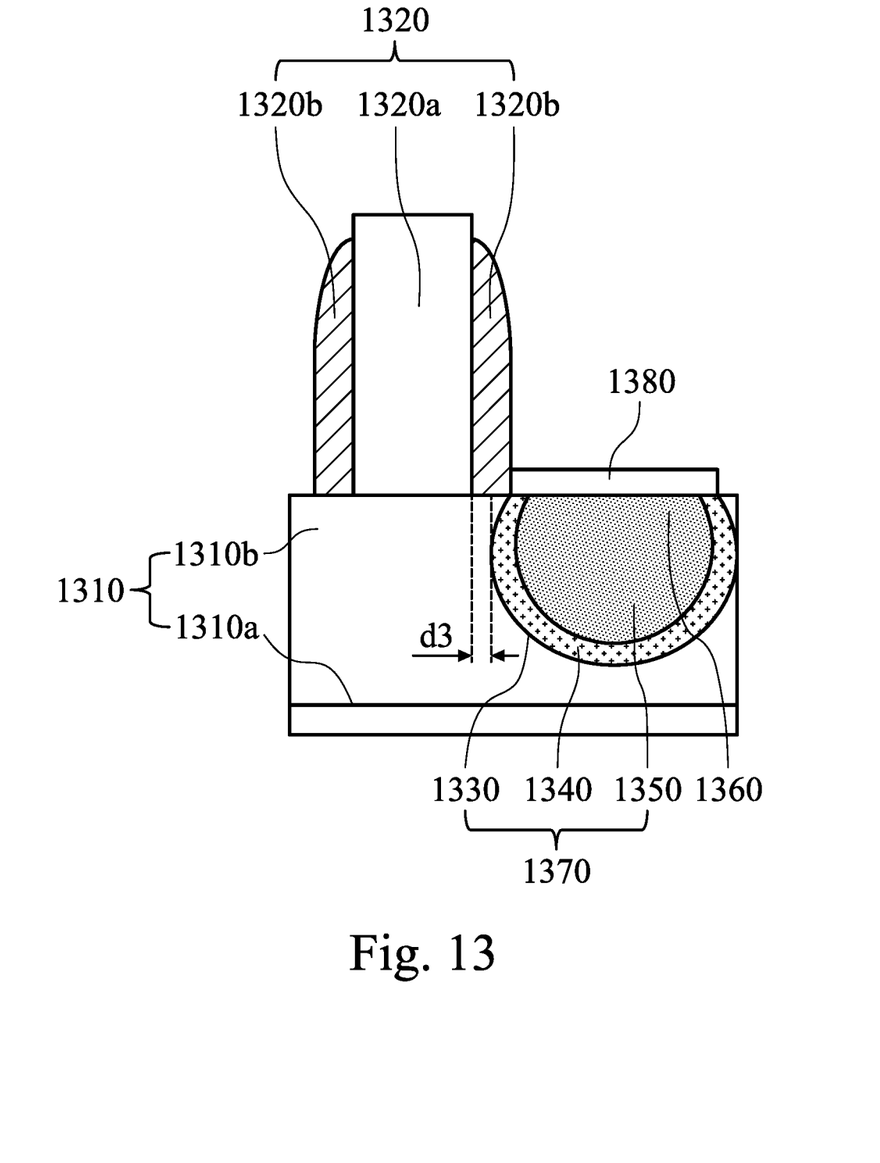
FIG. 13 depicts an example diagram showing a semiconductor structure.

FIG. 13 depicts an example diagram showing a semiconductor structure, e.g., a fin field-effect transistor (FinFET). In one embodiment, at least one of the semiconductor structures 104, 202, 404, 504 is a FinFET, e.g., the FinFET of FIG. 13. In another embodiment, the at least one of the semiconductor structures 104, 202, 404, 504 is a planar FET.

Figure 7:
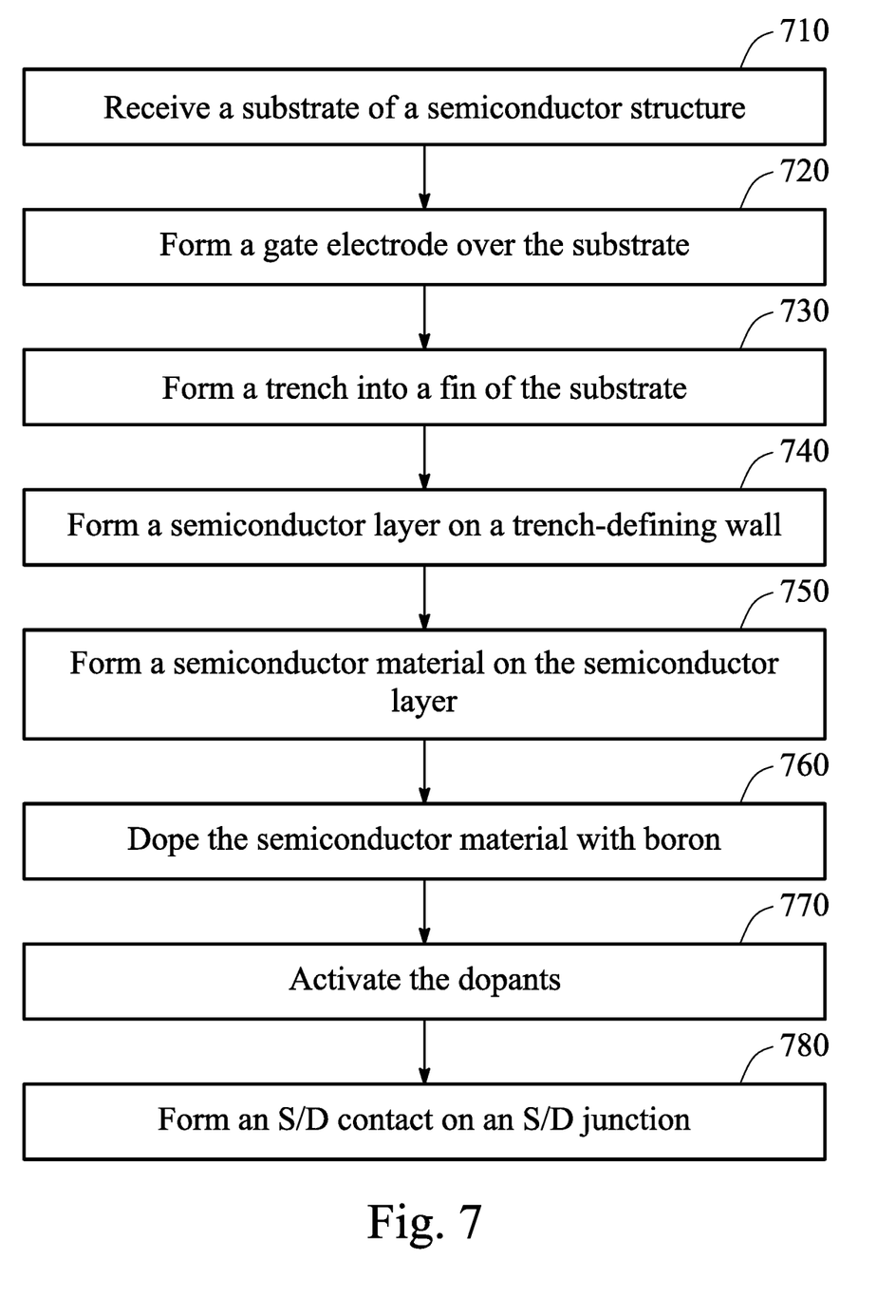
FIG. 7 depicts another example flow chart for dopant activation using microwave radiation.

FIG. 7 depicts another example flow chart for dopant activation using microwave radiation, i.e., interfacial polarization heating. As shown in FIG. 7, at 710, a substrate, e.g., the substrate 1310 of FIG. 13, of a semiconductor structure, e.g., the semiconductor structure 104 of FIG. 1, is received. As shown in FIG. 13, the substrate 1310 includes a surface 1310a and a fin 1310b that extends upward from the surface 1310a. In one embodiment, the substrate 1310 includes silicon, germanium, III-V compound, or a combination thereof. For example, the substrate 1310 includes about 95% silicon.

At 720, a gate electrode, e.g., the gate electrode 1320 of the semiconductor structure of FIG. 13, is formed over the substrate 1310. In one embodiment, the gate electrode 1320 is a dummy gate electrode. In another embodiment, the gate electrode 1320 is a functional gate electrode of a FinFET. As shown in FIG. 13, the gate electrode 1320 includes a gate 1320a that extends generally transverse to the fin 1310b and a spacer 1320b that is provided on each side of the gate 1320a. In one embodiment, the gate 1320a is made of polysilicon or any suitable metal material. Examples of metal materials include, but are not limited to, Tin, TaN, $ZrSi_2$, $MoSi_2$, $TaSi_2$, $NiSi_2$, WN, and other suitable p-type work function metal materials.

At 730, a trench is formed that extends into the fin 1310b and that is defined by a trench-defining wall, e.g., the trench-defining wall 1330 of the semiconductor structure of FIG. 13. In one embodiment, the trench has a depth of between about 30 nm and about 70 nm from a surface of the fin 1310b.

At 740, a semiconductor layer, e.g., the semiconductor layer 1340 of the semiconductor structure of FIG. 13, is formed on the trench-defining wall 1330 to partially fill the trench. For example, the semiconductor layer 1340 has a thickness of between about 5 nm and about 15 nm. In one embodiment, the semiconductor layer 1340 includes germanium. The semiconductor layer 1340 may further include silicon, boron, or a combination thereof. For example, the semiconductor layer 1340 is made of silicon germanium or silicon germanium doped with boron. In some embodiments, a percentage composition of the germanium of the semiconductor layer 1340 is less than about 50%, e.g., about 35%. In some embodiments, a concentration of the boron of the semiconductor layer 1340 is between about 1E21 atoms/$cm^3$ and about 5E21 atoms/$cm^3$, e.g., about 3.7E21 atoms/$cm^3$.

In one embodiment, operation 740 includes forming two or more sublayers of the semiconductor layer 1340 such that percentage compositions of germanium gradually increase from an outermost sublayer of the two or more sublayers to an innermost sublayer of the two or more sublayers. In another embodiment, operation 740 includes forming two or more sublayers of the semiconductor layer 1340 such that concentrations of boron gradually decrease from an outermost sublayer of the two or more sublayers to an innermost sublayer of the two or more sublayers.

At 750, a semiconductor material, e.g., the semiconductor material 1350 of the semiconductor structure of FIG. 13, is formed on the semiconductor layer 1340 to substantially fill the trench. In one embodiment, the semiconductor material 1350 includes germanium. The semiconductor material 1350 may further include silicon, boron, or a combination thereof. For example, the semiconductor material 1350 is made of silicon germanium or silicon germanium doped with boron. In some embodiments, a percentage composition of the germanium of the semiconductor material 1350 is greater than a percentage composition of germanium of the semiconductor layer 1340. For example, the percentage composition of the germanium of the semiconductor material 1350 is between about 50% and about 95%. In some embodiments, a concentration of the boron of the semiconductor material 1350 is less than a concentration of boron of the semiconductor layer 1340. For example, the concentration of the boron of the semiconductor material 1350 is between about 2E20 atoms/$cm^3$ and about 1E21 atoms/$cm^3$.

At 760, the semiconductor material 1350 is doped with boron such that an upper layer 1360 of the semiconductor material 1350 has a higher concentration of the boron than a lower layer of the semiconductor material 1350. For example, the concentration of the boron of the upper layer 1360 is between about 1E21 atoms/$cm^3$ and about 5E21 atoms/$cm^3$. In one embodiment, the boron of the upper layer 1360 has a depth of between about 5 nm and about 15 nm from the surface of the fin 1310b.

It is noted that at least one of the trench-defining wall 1330, the semiconductor layer 1340, and the semiconductor material 1350 constitute a source/drain (S/D) junction 1370 of the semiconductor structure 104. In one embodiment, the S/D junction 1370 and the gate 1320a define therebetween a distance of between about 1 nm and about 9 nm.

In some embodiments, the S/D junction 1370 is formed above a substrate, e.g., a bulk substrate or a silicon-on-insulator (SOI) substrate. In other embodiments, the S/D junction 1370 extends from above into a substrate.

At 770, the dopants, i.e., the germanium and the boron of the semiconductor material 1350, are activated, in a manner that will be described hereinafter.

Figure 8:
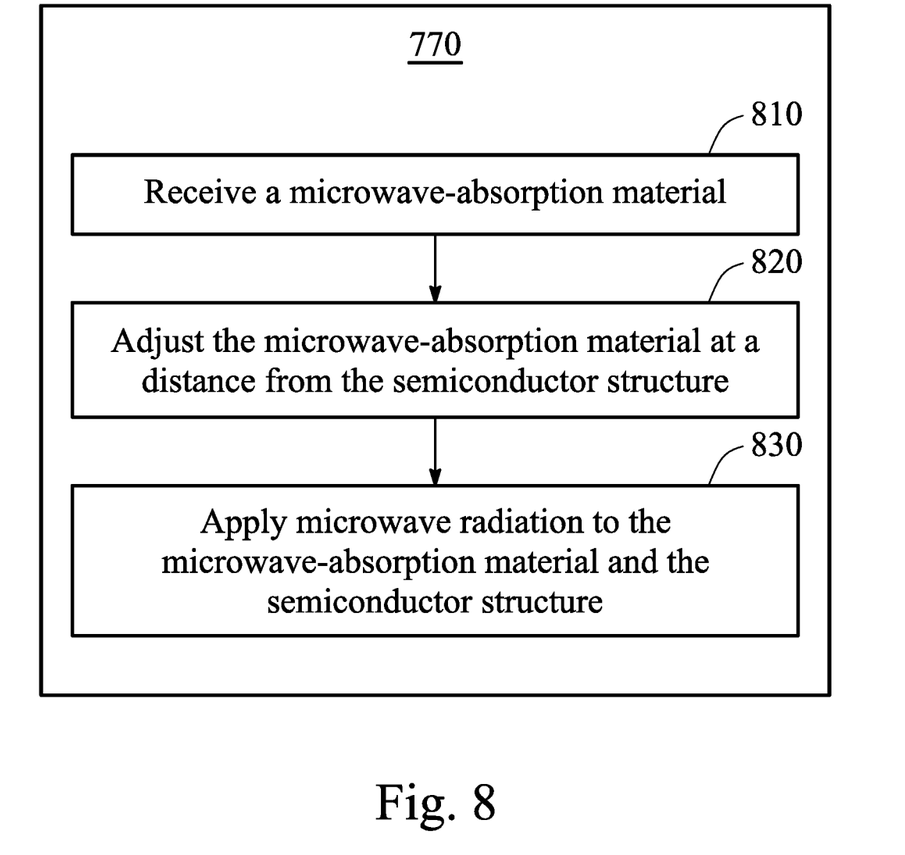
FIG. 8 depicts an example flow chart of operation 770 of FIG. 7.

FIG. 8 depicts an example flow chart of operation 770 of FIG. 7. As shown in FIG. 8, at 810, a microwave-absorption material, e.g., the microwave-absorption material 102 of FIG. 1, is received. At 820, the microwave-absorption material 102 is adjusted at a distance, e.g., distance d as shown in FIG. 1, from the semiconductor structure 104 so as to improve dopant activation. In one embodiment, the distance d is between about 2 mm and about 10 mm. At 830, microwave radiation is applied to the microwave-absorption material 102 and the semiconductor structure 104 so as to activate the dopants.

Figure 12:
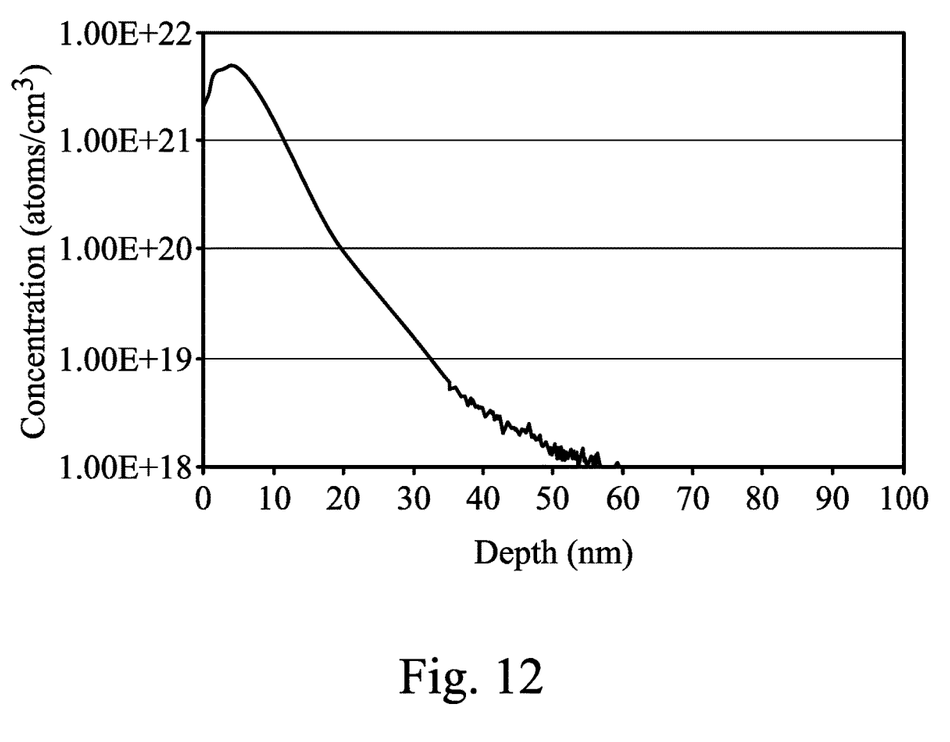
FIG. 12 depicts an example plot showing concentration versus depth.

During operation 830, the microwave-absorption material 102 increases absorption of the microwave radiation by the boron of the upper layer 1360 such that the boron of the upper layer 1360 generates heat at a temperature, e.g., higher than 1100° C., whereby the boron of the upper layer 1360 is activated. As a result, a relatively high concentration of the activated boron, i.e., substantially the same as the concentration of the boron of the upper layer 1360 prior to operation 770, is obtained for the upper layer 1360 of the semiconductor material 1350 of the S/D junction 1370 of the semiconductor structure 104 of the present disclosure. FIG. 12 depicts an example plot showing concentration versus depth. In one embodiment, as shown in FIG. 12, the concentration of the activated boron of the upper layer 1360 of the semiconductor material 1350 of the S/D junction 1370 of the semiconductor structure 104 is between about 1E21 atoms/cm$^3$ and about 5E21 atoms/cm$^3$. In another embodiment, the activated boron of the lower layer of the semiconductor material 1350 has substantially the same concentration as the boron of the lower layer of the semiconductor material 1350 prior to operation 770. For example, the concentration of the activated boron of the lower layer of the semiconductor material 1350 is between about 2E20 atoms/cm$^3$ and about 1E21 atoms/cm$^3$. In yet another embodiment, the activated boron of the semiconductor layer 1340 has substantially the same concentration as the boron of the semiconductor layer 1340 prior to operation 770. For example, the concentration of the activated boron of the semiconductor layer 1340 is between about 1E21 atoms/cm$^3$ and about 5E21 atoms/cm$^3$.

In addition, during operation 830, i.e., the application of the microwave radiation to the microwave-absorption material 102 and the semiconductor structure 104, crystal defects created from prior operations are reduced and a relatively low crystal defect density is achieved for the activated germanium and the activated boron of the semiconductor material 1350 of the S/D junction 1370 of the semiconductor structure 104 of the present disclosure. In one embodiment, the crystal defect density of the activated germanium of the semiconductor material 1350 of the S/D junction 1370 of the semiconductor structure 104 is less than about 1E12 atoms/cm$^3$. For example, the crystal defect density of the activated germanium of the semiconductor material 1350 of the S/D junction 1370 of the semiconductor structure 104 is about 1E7 atoms/cm$^3$. In another embodiment, the crystal defect density of the activated boron of the upper layer 1360 of the semiconductor material 1350 of the S/D junction 1370 of the semiconductor structure 104 is between about 1E5 atoms/cm$^3$ and about 1E7 atoms/cm$^3$.

In some embodiments, the activated germanium of the semiconductor layer 1340 has substantially the same percentage composition, e.g., less than about 50%, as the germanium of the semiconductor layer 1340 prior to operation 770. In other embodiments, the activated germanium of the semiconductor material 1350 has substantially the same percentage composition, e.g., between about 50% and 95%, as the germanium of the semiconductor material 1350 prior to operation 770.

Moreover, during operation 830, i.e., the application of the microwave radiation to the microwave-absorption material 102 and the semiconductor structure 104, the substrate 1310 is kept at a temperature between about 500° C. and about 600° C. Thus, unlike the conventional technology for dopant activation, e.g., RTA, in which the entire semiconductor structure is heated at a temperature higher than e.g., 950° C., the boron of the upper layer 1360 of the S/D junction 1370 of the semiconductor structure 104 is selectively heated at a higher temperature, whereas the substrate 1310 of the semiconductor structure 104 at a lower temperature. The substrate 1310 thus serves as a heatsink and permits a temperature of the semiconductor structure 104 to ramp down at a faster rate. As a result, the activated boron of the upper layer 1360 of the semiconductor material 1350 of the S/D junction 1370 of the semiconductor structure 104 of the present disclosure has a relatively shallow depth, i.e., substantially the same as the depth of the boron of the upper layer 1360 prior to operation 770. In one embodiment, as shown in FIG. 12, the activated boron of the upper layer 1360 of the semiconductor material 1350 of the S/D junction 1370 of the semiconductor structure 104 has a depth of between about 5 nm and about 15 nm from a surface of the S/D junction 1370.

In an embodiment, after operation 770, i.e., the activation of the dopants, the S/D junction 1370 has a depth of between about 30 nm and about 70 nm. In addition, after operation 770, the semiconductor layer 1340 is maintained at substantially the same thickness, e.g., between about 5 nm and about 15 nm. Moreover, after operation 770, as shown in FIG. 13, the S/D junction 1370 and the gate 1320*a* define therebetween a distance d3 of between about 1 nm and about 9 nm.

Referring back to FIG. 7, at 780, an S/D contact, e.g., the S/D contact 1380 of the semiconductor structure of FIG. 13, is formed on the S/D junction 1370. Examples of materials for the S/D contact 1380 include, but are not limited to, tungsten, aluminum, titanium, nickel, cobalt, and the like.

It is noted that, since the semiconductor material 1350 of the S/D junction 1370 has a high percentage composition of the germanium and since the boron of the upper layer 1360 of the semiconductor material 1350 of the S/D junction 1370 has a shallow depth and a high concentration, the S/D contact 1380 and the S/D junction 1370 of the semiconductor structure 104 of the present disclosure have a relatively low contact resistivity therebetween. In one embodiment, the contact resistivity between the S/D contact 1380 and the S/D junction 1370 of the semiconductor structure 104 is less than about 5E-9 Ohms-cm$^2$. For example, the contact resistivity between the S/D contact 1380 and the S/D junction 1370 of the semiconductor structure 104 is about 8E-10 Ohms-cm$^2$.

Figure 9:
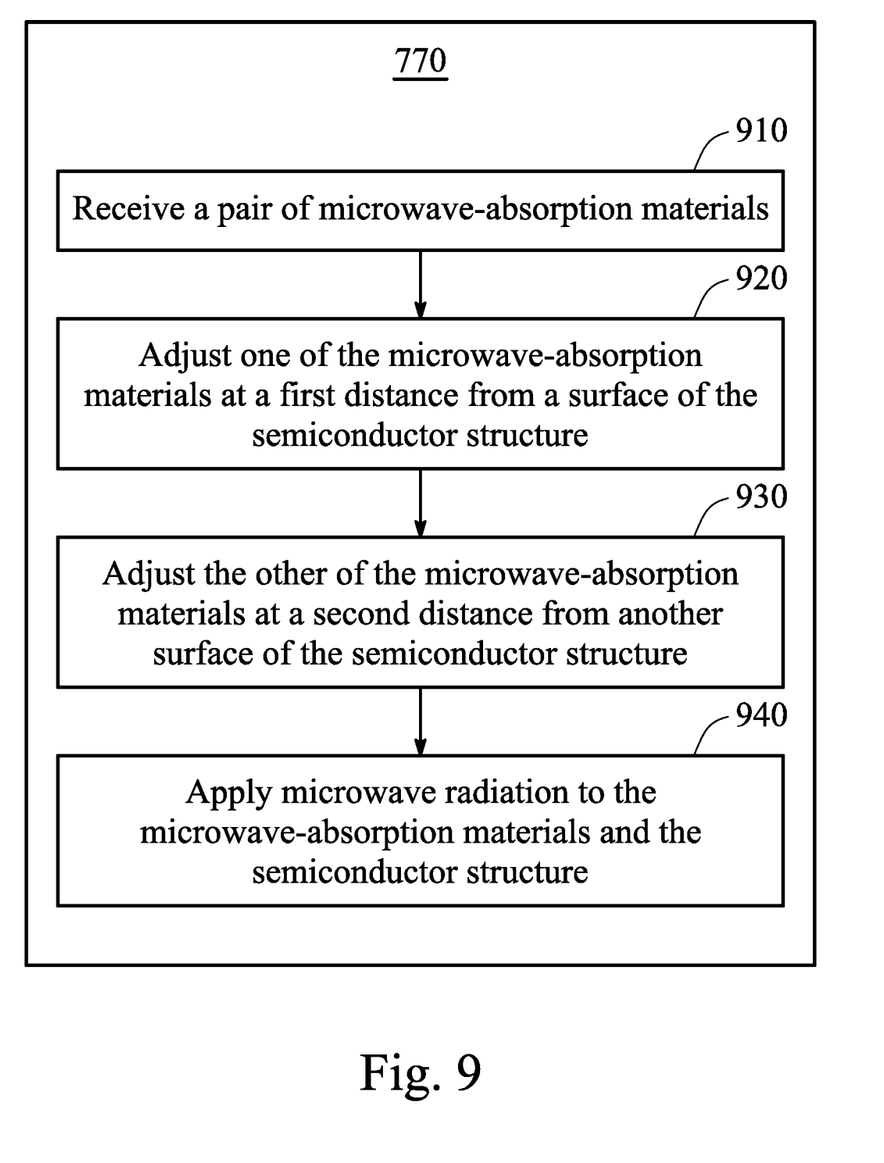
FIG. 9 depicts another example flow chart of operation 770 of FIG. 7.

FIG. 9 depicts another example flow chart of operation 770 of FIG. 7. As shown in FIG. 9, at 910, a pair of microwave-absorption materials, e.g., the microwave-absorption materials 204, 206 of FIG. 2, between which the semiconductor structure, e.g., the semiconductor structure 202 of FIG. 2, is placed, are received. At 920, the microwave-absorption material 204 is adjusted at a distance, e.g., distance d1 as shown in FIG. 2, from a surface of the semiconductor structure 202 so as to improve dopant activation. In one embodiment, the distance d1 is between about 2 mm and about 10 mm. At 930, the microwave-absorption material 206 is adjusted at a distance, e.g., distance d2 as shown in FIG. 2, from another surface of the semiconductor structure 202 also to improve dopant activation. In one embodiment, the distance d2 is between about 2 mm and about 10 mm. At 940, microwave radiation is applied to the microwave-absorption materials 204, 206 and the semiconductor structure 202 so as to activate the dopants.

Figure 10:
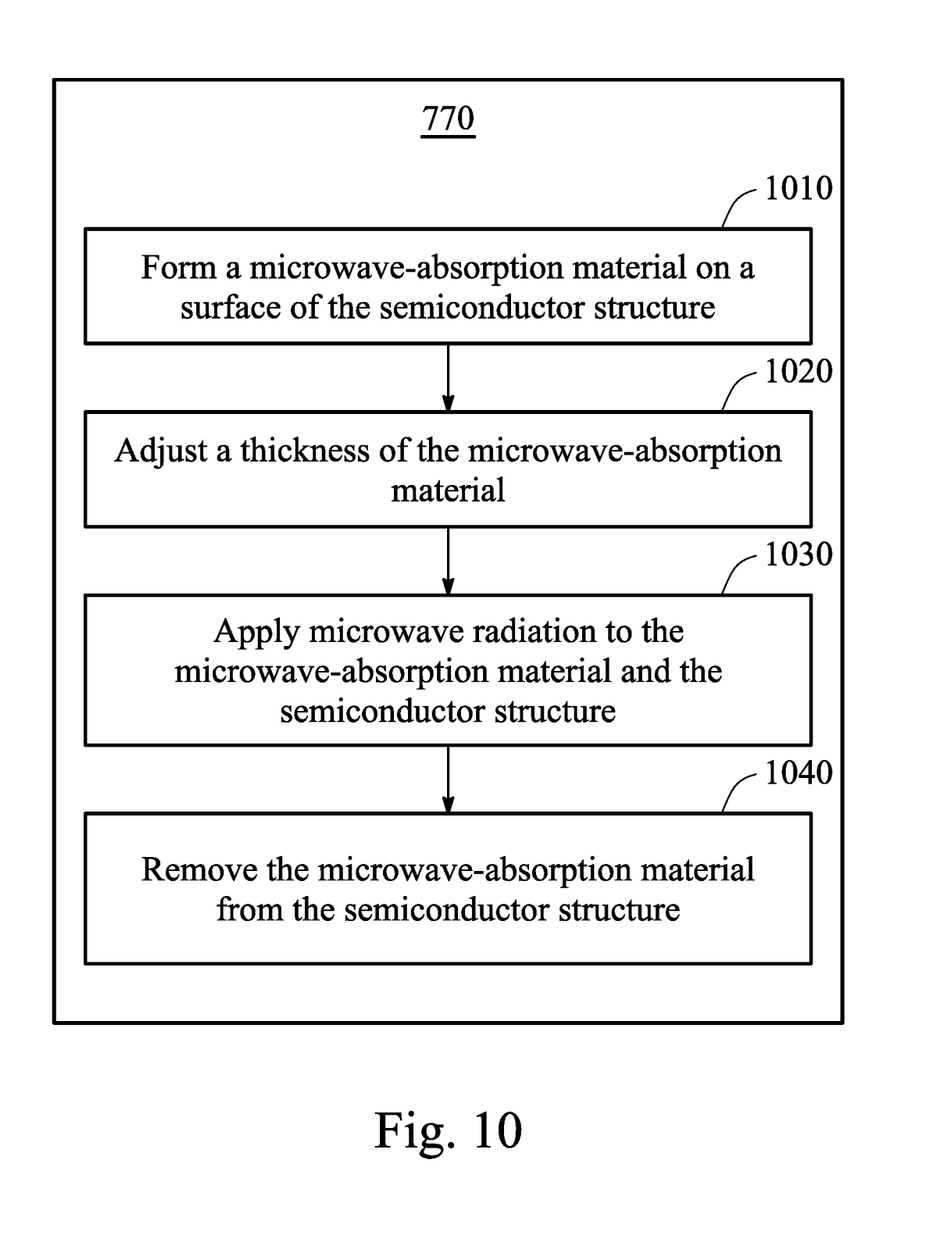
FIG. 10 depicts another example flow chart of operation 770 of FIG. 7.

FIG. 10 depicts another example flow chart of operation 770 of FIG. 7. As shown in FIG. 10, at 1010, a microwave-absorption material, e.g., the microwave-absorption material 402 of FIG. 4, is formed on, e.g., in conformance with, a surface of the semiconductor structure, e.g., the semiconductor structure 404 of FIG. 4. At 1020, a thickness of the microwave-absorption material 402 is adjusted, e.g., between about 30 nm and about 250 nm, so as to improve dopant activation. At 1030, microwave radiation is applied to the microwave-absorption material 402 and the semiconductor structure 404 so as to activate the dopants. At 1040, the microwave-absorption material 402 is removed, e.g., through wet etching, dry etching, chemical-mechanical polishing, or a combination thereof, from the semiconductor structure 404.

Figure 11:
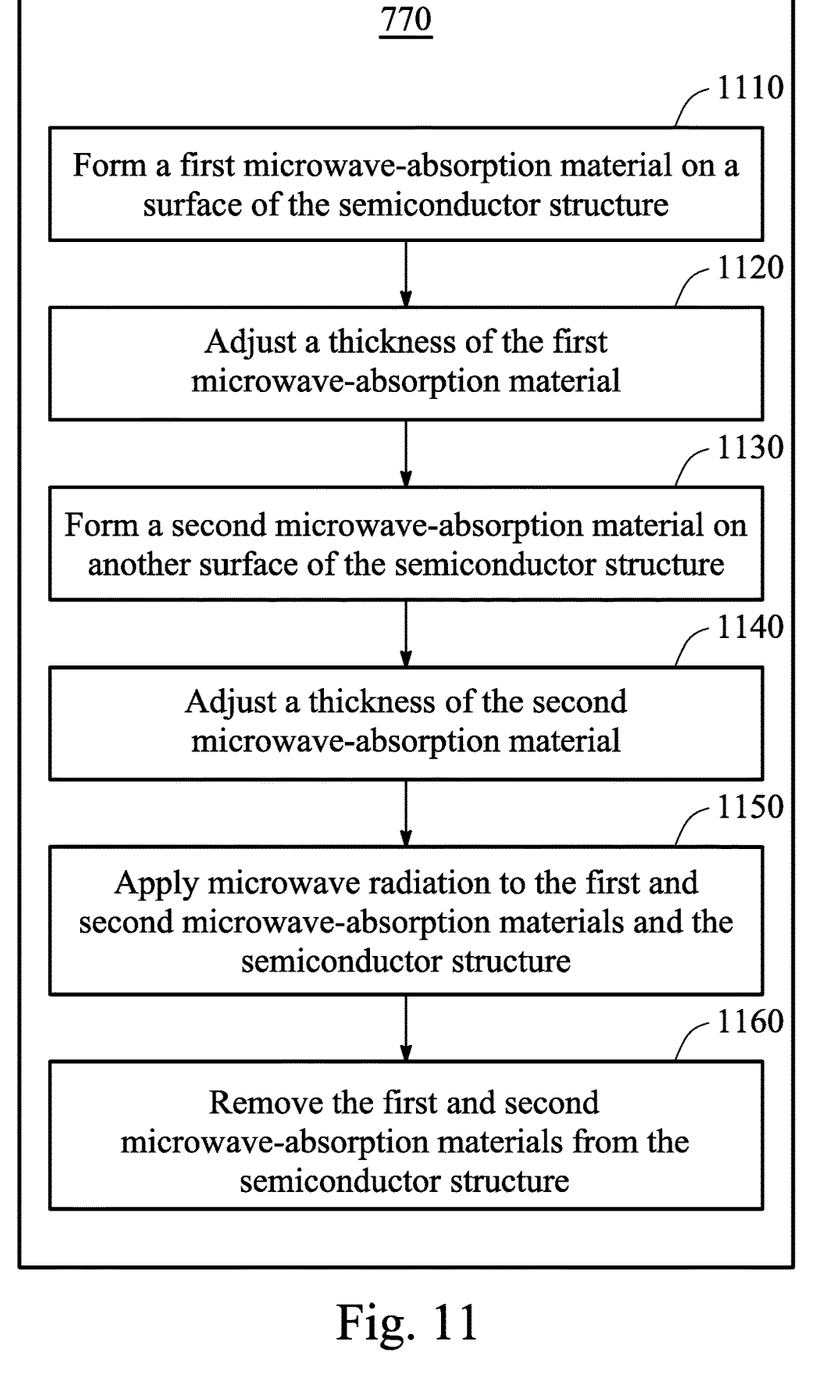
FIG. 11 depicts another example flow chart of operation 770 of FIG. 7.

FIG. 11 depicts another example flow chart of operation 770 of FIG. 7. As shown in FIG. 11, at 1110, a first microwave-absorption material, e.g., the microwave-absorption material 502 of FIG. 5, is formed on, e.g., in conformance with, a surface of the semiconductor structure, e.g., the semiconductor structure 504 of the FIG. 5. At 1120, a thickness of the microwave-absorption material 502 is adjusted, e.g., between about 30 nm and about 250 nm, so as to improve dopant activation. At 1130, a second microwave-absorption material, e.g., the microwave-absorption material 506 of FIG. 5, is formed on, e.g., in conformance with, another surface of the semiconductor structure 504. At 1140, a thickness of the microwave-absorption material 506 is adjusted, e.g., between about 30 nm and about 250 nm, also to improve dopant activation. At 1150, microwave radiation is applied to the microwave-absorption materials 502, 506 and the semiconductor structure 504 so as to activate the dopants. At 1160, the microwave-absorption materials 502, 506 are removed from the semiconductor structure 504.

In one embodiment, a lightly-doped S/D (LDD) associated with a substrate of a semiconductor structure is formed. The formation of an LDD includes: doping a region of the semiconductor structure with a plurality of dopants; receiving a microwave-absorption material or forming the microwave-absorption material on the semiconductor structure; adjusting the microwave-absorption material at a distance from the semiconductor structure or adjusting a thickness of the microwave-absorption material; and applying microwave radiation to the microwave-absorption material and the semiconductor structure.

In an embodiment, a semiconductor structure comprises a substrate, a source/drain (S/D) junction, and an S/D contact. The S/D junction is associated with the substrate and includes a trench-defining wall that defines a trench, a semiconductor layer that is formed over the trench-defining wall, that partially fills the trench, that substantially covers the trench-defining wall, and that includes germanium, and a semiconductor material that is formed over the semiconductor layer and that includes germanium, a percentage composition of which is greater than a percentage composition of the germanium of the semiconductor layer. The S/D contact is formed over the S/D junction.

In another embodiment, a semiconductor structure comprises a substrate, a source/drain (S/D) junction, and an S/D contact. The S/D junction is associated with the substrate and includes a trench-defining wall, a semiconductor layer that is formed over the trench-defining wall and that has a plurality of sublayers, and a semiconductor material that is formed over the semiconductor layer. A concentration of boron of an outermost sublayer of the sublayers is greater than a concentration of boron of an innermost sublayer of the sublayers. The S/D contact is formed over the S/D junction.

In another embodiment, a source/drain (S/D) junction comprises a semiconductor layer and a semiconductor material. The semiconductor layer is formed on a substrate and includes germanium. And a semiconductor material that is formed over the semiconductor layer and includes germanium. The percentage composition of the semiconductor material is greater than a percentage composition of the germanium of the semiconductor layer.

In another embodiment, a semiconductor structure comprising a S/D junction associated with a substrate and a S/D contact. The S/D junction includes a semiconductor layer and a semiconductor material having a plurality of sublayers. The S/D contact is formed over the S/D junction. The sublayers include a concentration of boron of an outermost sub-layer greater than a concentration of boron of an innermost sub-layer of the plurality of sub-layers. The semiconductor material is over the semiconductor layer.

In another embodiment, a method comprises providing a semiconductor structure that includes a substrate, forming a source/drain (S/D) junction, and forming an S/D contact over the semiconductor material. Forming the S/D junction includes: forming in the substrate a trench that is defined by a trench-defining wall; forming over the trench-defining wall a semiconductor layer that partially fills the trench, that substantially covers the trench-defining wall, and that includes germanium; and forming over the semiconductor layer a semiconductor material that includes germanium, a percentage composition of which is greater than a percentage composition of the germanium of the semiconductor layer.

In another embodiment, a method comprises forming a source/drain junction above a substrate, forming over the substrate a semiconductor layer that includes germanium, and forming over the semiconductor layer a semiconductor material that includes germanium, and forming an S/D contact over the S/D junction. The percentage composition the semiconductor material is greater than a percentage composition of the germanium of the semiconductor layer.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A source/drain (S/D) junction of a transistor comprising:
    a first silicon-and-germanium-containing layer disposed directly on a substrate;
    a second silicon-and-germanium-containing layer disposed directly on the first silicon-and-germanium-containing layer, wherein a percentage composition of germanium of the second silicon-and-germanium-containing layer is greater than a percentage composition of germanium of the first silicon-and-germanium-containing layer; and
    wherein the first silicon-and-germanium-containing layer and the second silicon-and-germanium-containing layer are each doped with boron, and further wherein a concentration of boron of the second silicon-and-germanium-containing layer is less than a concentration of boron of the first silicon-and-germanium-containing layer.

2. The S/D junction of claim 1, wherein the concentration of boron of the second silicon-and-germanium-containing layer is about 2E20 atoms/cm$^3$ to about 1E21 atoms/cm$^3$ and the concentration of boron of the first silicon-and-germanium-containing layer is about 1E21 atoms/cm$^3$ to about 3.7E21 atoms/cm$^3$.

3. The S/D junction of claim 1, wherein the percentage composition of germanium of the second silicon-and-germanium-containing layer is between about 50% and about 95% and the percentage composition of germanium of the first silicon-and-germanium-containing layer is between about 35% and about 50%.

4. The S/D junction of claim 1, wherein a percentage composition of germanium of the first silicon-and-germanium-containing layer increases from an outermost portion of the first silicon-and-germanium-containing layer interfacing with the substrate to an innermost portion of the first silicon-and-germanium-containing layer interfacing with the second silicon-and-germanium-containing layer.

5. The S/D junction of claim 4, wherein the concentration of boron of the first silicon-and-germanium-containing layer decreases from the outermost portion of the first silicon-and-germanium-containing layer interfacing with the substrate to the innermost portion of the first silicon-and-germanium-containing layer interfacing with the second silicon-and-germanium-containing layer.

6. A semiconductor structure comprising:
    a source/drain (S/D) junction associated with a substrate and including:
        a source/drain semiconductor layer disposed directly on the substrate, wherein the source/drain semiconductor layer includes a first concentration of boron, and
        a source/drain semiconductor material that includes a second concentration of boron disposed directly on the source/drain semiconductor layer, wherein the second concentration of boron is less than the first concentration of boron; and
    a S/D contact disposed over the S/D junction.

7. The semiconductor structure of claim 6, wherein the source/drain semiconductor layer further includes a first percentage composition of germanium and the source/drain semiconductor material further includes a second percentage composition of germanium, wherein the second percentage composition of germanium is greater than the first percentage composition of germanium.

8. The semiconductor structure of claim 6, wherein the source/drain semiconductor material includes an upper layer and a lower layer, wherein the lower layer is disposed between the source/drain semiconductor layer and the upper layer, and further wherein the lower layer includes the second concentration of boron and the upper layer includes a third concentration of boron that is greater than the second concentration of boron.

9. The semiconductor structure of claim 8, wherein a thickness of the upper layer from a top surface of the S/D junction to the lower layer is about 5 nm to about 15 nm.

10. The semiconductor structure of claim 6, wherein the first concentration of boron of the source/drain semiconductor layer decreases from an interface of the source/drain semiconductor layer with the substrate to an interface of the source/drain semiconductor layer with the source/drain semiconductor material.

11. The semiconductor structure of claim 6, wherein the substrate includes silicon, the source/drain semiconductor layer includes silicon and germanium, and the source/drain semiconductor material includes silicon and germanium.

12. The semiconductor structure of claim 6, wherein the substrate is a fin of fin-like field effect transistor.

13. A method of forming a source/drain junction comprising:
    forming a first silicon-and-germanium-containing layer directly on a substrate, wherein the first silicon-and-germanium-containing layer includes a first percentage composition of germanium;
    forming a second silicon-and-germanium-containing layer directly on the first silicon-and-germanium-containing layer, wherein the second silicon-and-germanium-containing layer includes a second percentage composition of germanium that is greater than the first percentage composition of germanium;
    doping the first silicon-and-germanium-containing layer and the second silicon-and-germanium-containing layer with boron, wherein a boron concentration of the second silicon-and-germanium-containing layer is less than a boron concentration of the first silicon-and-germanium-containing layer; and
    forming a S/D contact over the second silicon-and-germanium-containing layer.

14. The method of forming a S/D junction of claim 13, further comprising:
    forming microwave-absorption material on the S/D junction;
    applying microwave radiation to the microwave-absorption material; and
    etchably removing the microwave-absorption material.

15. The method of forming a S/D junction of claim 13, wherein a boron concentration of an upper layer of the second silicon-and-germanium-containing layer is greater than a boron concentration of a lower layer of the second silicon-and-germanium-containing layer.

16. The method of forming a S/D junction of claim 13, wherein forming the first silicon-and-germanium-containing layer includes:

forming an innermost sublayer having a first percentage composition of germanium, wherein the innermost sublayer interfaces with the second silicon-and-germanium-containing layer; and forming an outermost sublayer having a second percentage composition of germanium that is less than the first percentage composition of germanium, wherein the outermost sublayer interfaces with the substrate.

17. The method of forming a S/D junction of claim 16, wherein a boron concentration of the outermost sublayer is greater than a boron concentration of the innermost sublayer.

18. The method of forming a S/D junction of claim 13, wherein the first percentage composition of germanium is between about 35% and about 50% and the second percentage composition of germanium is between about 50% and about 95%.

19. The method of forming a S/D junction of claim 13, wherein the substrate is a fin of a fin-like field effect transistor.

20. The method of forming an S/D junction of claim 13, wherein the second percentage composition of germanium of the second silicon-and-germanium-containing layer increases from a bottom surface of the second silicon-and-germanium-containing layer that interfaces with the first silicon-and-germanium-containing layer to a top surface of the second silicon-and-germanium-containing layer.

* * * * *